United States Patent [19]
Baba

[11] Patent Number: 5,686,739
[45] Date of Patent: Nov. 11, 1997

[54] THREE TERMINAL TUNNEL DEVICE

[75] Inventor: Toshio Baba, Tokyo, Japan

[73] Assignee: NEC Corporation, Japan

[21] Appl. No.: 594,383

[22] Filed: Jan. 31, 1996

Related U.S. Application Data

[63] Continuation of Ser. No. 272,902, Jul. 8, 1994, abandoned, which is a continuation of Ser. No. 926,341, Aug. 6, 1992, abandoned.

[30] Foreign Application Priority Data

Aug. 6, 1991 [JP] Japan .................. 3-196321

[51] Int. Cl.$^6$ .................. H01L 29/868; H01L 29/885
[52] U.S. Cl. .................. 257/105; 257/104; 257/106; 257/46; 257/192; 257/347
[58] Field of Search .................. 257/104, 105, 257/106, 192, 46, 347

[56] References Cited

U.S. PATENT DOCUMENTS

| | | | |
|---|---|---|---|
| 3,308,354 | 3/1967 | Tucker | 257/77 |
| 4,173,763 | 11/1979 | Chang et al. | 257/105 |
| 4,198,644 | 4/1980 | Esaki | 257/104 |
| 4,458,261 | 7/1984 | Omura | 357/23.7 |
| 4,835,581 | 5/1989 | Kuroda et al. | 357/16 |
| 4,925,805 | 5/1990 | van Ommen et al. | 257/347 |
| 5,034,784 | 7/1991 | Yamazaki | 257/77 |
| 5,105,247 | 4/1992 | Cavanaugh | 257/105 |
| 5,107,315 | 4/1992 | Kumagai et al. | 257/77 |

FOREIGN PATENT DOCUMENTS

| | | | |
|---|---|---|---|
| 0256360 | 2/1988 | European Pat. Off. | |
| 458570 | 5/1991 | European Pat. Off. | |
| 2490874 | 3/1982 | France | |
| 2607630 | 6/1988 | France | 257/105 |
| 3334167 | 4/1985 | Germany | 257/104 |
| 58-96766 | 6/1983 | Japan | |

OTHER PUBLICATIONS

Mienes, *Solid State Elec* V. 129 No. 2 pp. 99–121 1986 "Semiconductor in Overview".

*Y. Omura, Lateral Unidirectional Bipolar-Type Insulated-Gate Transitors, *Japanese Journal of Applied Physics*, Supplements, vol. 22, No. 22-1, 1983, Tokyo, Japan, pp. 263–266.

*Primary Examiner*—Jerome Jackson
*Attorney, Agent, or Firm*—Ostrolenk, Faber, Gerb & Soffen, LLP

[57] ABSTRACT

Disclosed is a three terminal tunnel device exhibiting a tunneling of carriers in a forward direction. The device comprises an intrinsic semiconductor region, an n-type degenerate semiconductor source region abutting one side of the intrinsic semiconductor region, a p-type degenerate semiconductor drain region abutting an opposite side of the intrinsic semiconductor region, an insulation region separating the three semiconductor regions from a semiconductor substrate, and a gate electrode being provided over the intrinsic semiconductor region through an insulation layer, whereby voltage signals to be applied to the gate electrode permit controlling a carrier concentration at a surface of the intrinsic semiconductor region. The device permits controlling a tunneling current of a forward-biased degenerate p-n junction and a current-voltage characteristic manifesting a negative differential resistance with the gate voltage signals.

26 Claims, 2 Drawing Sheets

FIG.1

PRIOR ART

THREE TERMINAL TUNNEL DEVICE

This application is a continuation of Ser. No. 08/272,902 filed on Jul. 8, 1994 now abandoned, which is a continuation of Ser. No. 07/926,341 filed on Aug. 6, 1992 now abandoned.

BACKGROUND OF THE INVENTION

The invention relates to a semiconductor device, and more particularly to a three terminal tunnel device utilizing a tunneling phenomenon.

Quantum-effect devices are characterized by performance principles under quantum mechanics which are completely different from those of devices such as Si-MOSFETs or GaAs-MESFETs etc. Such quantum devices are known in various forms. Recently, a development of three terminal quantum devices capable of controlling a potential profile is desired.

One of such three terminal quantum devices has been proposed by Toshio Baba, the inventor of the present invention, which is disclosed in the Japanese laid-open patent publication No. 58-96766 (Japanese patent application No. 56-194992). This device utilizes either a Zener breakdown effect or an avalanche breakdown effect to have high speed performance. The device is also suitable for bistable switching devices.

Recently, the miniaturization of devices such as Si-MOSFETs or GaAs-MESFETs, has approached a limitation thereof. Quantum devices generally have advantages of a very small size and a high speed performance as compared with the Si-MOSFETs or the GaAs-MESFETs. However, such quantum devices are burdened with many difficult problems in the designing, the fabrication process or the manufacturing thereof.

Figure 1:
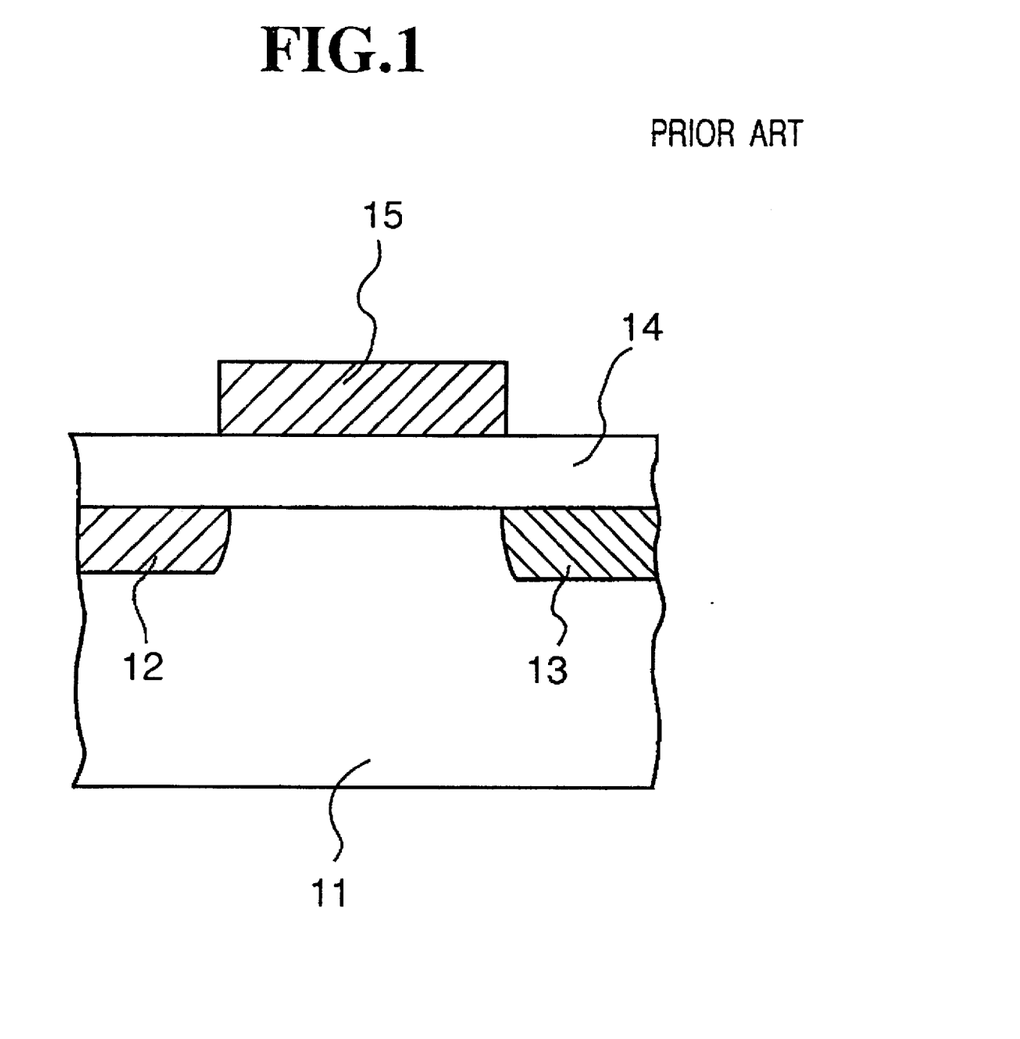
FIG. 1 is a fragmentary cross sectional elevation view illustrative of the structure of the conventional device.

In contrast, a three terminal quantum device has a simple structure. Also, the device may be fabricated by a relatively convenient process as compared with other quantum devices. FIG. 1 illustrates a typical structure of the three terminal device. The device includes a bulk 11 which is made of a semiconductor being doped with a dopant of one conductivity type. A source region 12 is made of a semiconductor being heavily doped with a dopant of the one conductivity type. The source region 12 is formed in an upper region of the bulk 11. While, a drain region 13 is made of a semiconductor being heavily doped with a dopant of the opposite conductivity type. The drain region is also formed in an upper region of the bulk 11. An insulation layer 14 covers an entire surface of the bulk 11. A gate electrode 15 is provided over a bulk surface region between the source and drain regions 12 and 13 through the insulation layer 14.

The operation of the three terminal device will hereinafter be described in which the bulk 11 and the source region 12 are p-type and the drain region 13 is n-type. The device has two current states, for instance, a tunneling current in the reverse direction which causes the Zener breakdown and a current in a reverse direction which causes the avalanche breakdown.

In a process of the Zener breakdown, the device is biased in the reverse direction. When no voltage is applied to the gate electrode 15, sufficient carriers are not caused at the bulk surface region under the gate electrode 15. Then, a sufficiently wide space charge region, or a depletion region exists at the p-n junction between the bulk surface region and the drain region 13. The space charge region may serve as a tunnel barrier. Therefore, no tunneling of carriers occurs, although the reverse bias is applied between the source and drain regions 12 and 13. Then, no tunneling current flows in which the device is in a first state as a bistable switching device.

Under the reverse bias, when a predetermined negative voltage is applied to the gate electrode 15, an accumulation layer filled with holes is produced at the bulk surface region under the gate electrode 15. Consequently, semiconductor in the bulk surface region is taken into a state approximately equivalent to that of the source region 12. Then, the $p^+$-$n^+$ junction is formed at an interface of the bulk surface region and the drain region 13, in which the tunnel barrier has a width of several ten angstroms or smaller. Since the device is biased in the reverse direction, the tunneling through the barrier in the reverse direction occurs at the $p^+$-$n^+$ junction to cause the Zener breakdown. At this time, the device is in a second state as a bistable switching device.

Under the reverse bias, when a positive voltage which is equal to or larger than a threshold voltage is applied to the gate electrode 15, an inversion layer filled with electrons is caused at the bulk surface region under the gate electrode 15. Thus, a semiconductor in the bulk surface region is taken into a state approximately equivalent to that of the drain region 13. Then, the $p^+$-$n^+$ junction is formed at an interface of the bulk surface region and the source region 12. As the tunnel barrier of the junction is taken into a width of several ten angstroms or smaller, the tunneling of carriers through the barrier in the reverse direction occurs. Further, the tunneling causes the Zener breakdown to produce a relatively large current in the reverse direction.

As is known, under the reverse bias, the tunneling of carriers is possible in both degenerate and nondegenerate junctions. The nondegenerate junction is therefore available for the device, although it is unnecessary to be so.

Accordingly, under the reverse bias voltage, the current through the device remains approximately constant at zero, until the applied gate voltage approaches the threshold voltage. Then, as the applied gate voltage approaches the threshold voltage, the current increases very rapidly. It is therefore understood that the device permits the current state to switch very rapidly.

With regard to the process of the avalanche breakdown, if the applied gate voltage is relatively small, the width of the tunnel barrier is sufficiently wide to prevent the tunneling of carriers. However, if the reverse bias voltage approaches a threshold voltage to cause a sufficiently high electric field, typically in the range $10^5$ V/m or larger, the avalanche breakdown is caused at the tunnel barrier. Consequently, when a relatively high reverse bias voltage is applied between the source and the drain, a relatively small applied gate voltage permits the avalanche breakdown to be caused so that the current increases very rapidly. This device permits the current state to switch very rapidly.

From the set forth descriptions, it is understood that the device may utilize ether of the two junction breakdown effects, for instance, the Zener breakdown effect and the avalanche breakdown effect. The device has a high speed performance which is suitable for devices such as bistable switching devices. Actually, the device is superior to other devices such as MOSFETs or MESFETs etc.

In addition, the set forth three terminal quantum device has a small size and a relatively simple structure. This permits a high speed performance of integrated circuits and a high integration of integrated circuits to be promoted. It is however difficult for the device to satisfy further requirements of the high integration and the high speed performance of the integrated circuits. The limitations of the high integration and the high speed performance of the integrated circuits are associated with the number of devices to be used for integrated circuits. However, the device has a single function only, for instance, an amplification function suitable for the bistable switching device. Therefore, a large number of the set forth devices are required to be used for integrated circuits as compared with multiple function devices.

To breakthrough the problems, it is required to provide a novel three terminal quantum device having multiple functions in which the novel device utilizes quantum effects being completely different from the reverse-biased junction breakdown effects in the set forth device.

SUMMARY OF THE INVENTION

Accordingly, it is a primary object of the present invention to provide a novel three terminal quantum device which has multiple functions.

It is another object of the present invention to provide a novel three terminal quantum device which has a very small size and a simple structure.

It is still another object of the present invention to provide a novel three terminal quantum device which possesses a very high speed performance with a low power.

It is a further object of the present invention to provide a novel three terminal quantum device which possesses an improved electric stability.

The above and other objects, features, and advantages of the present invention will be apparent from following descriptions.

There is provided a novel three terminal tunnel device exhibiting a tunneling phenomenon in a forward-biased degenerate junction in which a current-voltage characteristic possesses a negative differential resistance region separating two positive differential resistance regions. Also, the novel three terminal tunnel device permits controlling a tunneling of carriers by applying a voltage signal to a control terminal. Further, the novel three terminal tunnel device permits controlling the current-voltage characteristic manifesting the negative differential resistance.

Therefore, the novel three terminal tunnel device according to the present invention essentially comprises a first degenerate semiconductor region of one conductivity type, a second semiconductor region in contact with the first degenerate semiconductor region, a third degenerate semiconductor region of opposite conductivity type in contact with the second semiconductor region, an insulation region separating the three semiconductor regions from a semiconductor substrate, and a control electrode provided over the second semiconductor region through an insulation layer.

In addition, the second semiconductor region may comprises either a nondegenerate semiconductor or a degenerate semiconductor. The insulation region and the insulation layer comprise materials having a larger energy band gap than that of the semiconductor substrate and that of the three semiconductor regions so as to permit providing an electric isolation. The first and third degenerate semiconductor regions have a sufficiently high doping concentration. Further, the first and third degenerate semiconductor region may be provided with electrodes which provide ohmic contacts to have a high contact conductance.

In the case that the second semiconductor region comprises a nondegenerate semiconductor (an enhancement mode), the control electrode is applied with a predetermined voltage so as to cause sufficient carriers in a surface region of the second semiconductor region. Consequently, a semiconductor of the nondegenerate state in the surface region is made into a degenerate semiconductor. Therefore, a forward-biased degenerate p-n junction is formed either between the first semiconductor region and the second semiconductor region or between the second semiconductor region and the third semiconductor region. In the degenerate p-n junction region, a space charge region serving as a tunnel barrier is made into a sufficiently thin barrier. When the first and third semiconductor regions are biased in a forward direction, the degenerate p-n junction is also biased in the forward direction. Thus, a tunneling of carriers in the forward direction occurs at the degenerate p-n junction. Then, a tunneling current flows through the tunneling barrier. A current-voltage characteristic of the device possesses a negative differential resistance region separating two positive differential resistance regions.

In addition, as the voltage applied to the control electrode further increases, a free-carrier concentration at the surface of the second semiconductor region also increases. Then, a large tunneling current or a large diffusion current flows. Therefore, the current-voltage characteristic is varied in association with the voltage applied to the control electrode.

In the case of the forward-biased degenerate p-n junction to be formed between the second semiconductor region and the third semiconductor region, the first semiconductor region may comprise a nearly degenerate semiconductor in which a Fermi level lies in the vicinity of either a conduction band edge (p-type) or a valence band edge (n-type).

When no voltage or a low voltage is applied to the control electrode, the semiconductor in the surface region of the second semiconductor region is taken into the nondegenerate state. At this time, since a sufficiently wide tunnel barrier, or space charge region exists at the p-n junction, the tunneling of carriers is interrupted. Also, the current through the device is interrupted.

On the other hand, the second semiconductor region may comprise a degenerate semiconductor. In this case (a depletion mode), when no voltage is applied to the control electrode, the forward-biased degenerate p-n junction is formed at either an interface of the first semiconductor region and the second semiconductor region or an interface of the second semiconductor region and the third semiconductor region. Then, the tunneling of carriers in the forward direction occurs. Also, the current flows through the device. While, when a predetermined voltage is applied to the control electrode, the semiconductor in the surface region of the second semiconductor region is taken into the nondegenerate state. At this time, since a sufficiently wide tunnel barrier, or space charge region exists at the p-n junction, the tunneling is interrupted. The current through the device is also interrupted.

It is therefore understood that the novel three terminal tunnel device permits controlling the tunnel current and the current-voltage characteristic.

BRIEF DESCRIPTION OF THE DRAWINGS

Preferred embodiments of the present invention will hereinafter fully be described in detail with reference to the accompanying drawings.

PREFERRED EMBODIMENTS OF THE INVENTION

In the structure, the three terminal tunnel device according to the present invention essentially comprises a first degenerate semiconductor region of one conductivity type, a second semiconductor region in contact with the first degenerate semiconductor region, a third degenerate semiconductor region of opposite conductivity type in contact with the second semiconductor region, an insulation region separating the three semiconductor regions from a semiconductor substrate, and a control electrode provided over the second semiconductor region through an insulation layer.

In addition, the second semiconductor region may comprise either a nondegenerate semiconductor or a degenerate semiconductor. The insulation region the insulation layer comprise materials having a larger energy band gap than that of the semiconductor substrate and that of the three semiconductor regions so as to provide an electric isolation. The first and third degenerate semiconductor regions have a sufficiently high doping concentration. Further, the first and third degenerate semiconductor regions may be provided with electrodes with ohmic contacts to have a high contact conductance.

Figure 2:
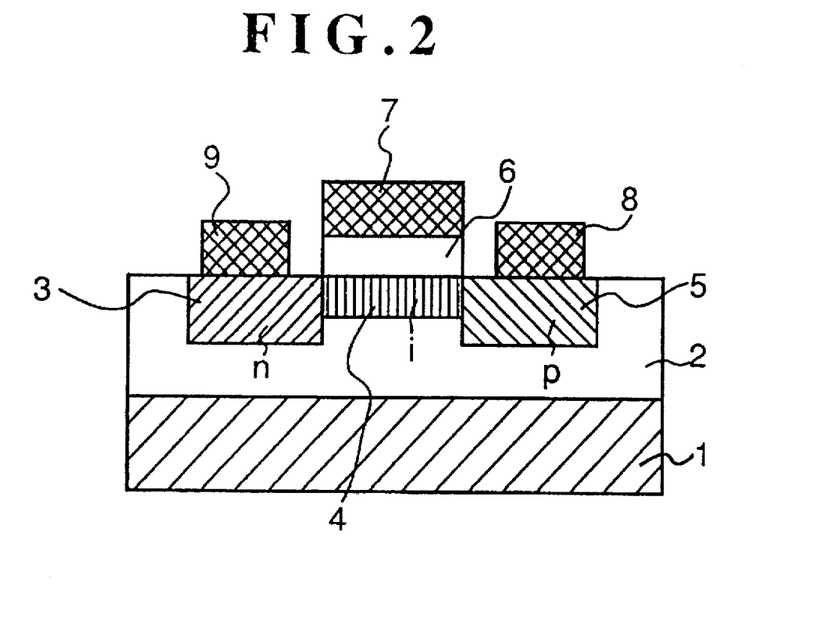
FIG. 2 is a fragmentary cross sectional elevation view illustrative of a structure of one embodiment of a three terminal tunnel device according to the present invention.

In a first preferred embodiment as shown in FIG. 2, the first semiconductor region 3 is heavily doped with a n-type dopant so as to take a semiconductor into a degenerate state in which the Fermi level lies in the conduction band. The second semiconductor region 4 is subjected to no doping. Then, the second semiconductor region 4 is made of an intrinsic semiconductor. While, the third semiconductor region 5 is heavily doped with a p-type dopant so as to take a semiconductor into a degenerate state in which the Fermi level lies in the valance band. The insulation region 2 is made of a material which has a wider band gap than that of the three semiconductor regions 3, 4 and 5 and that of the semiconductor substrate so that the insulation region 2 permits providing an electric isolation. The insulation layer 6 is also made of a material which has a wider band gap than that of the three semiconductor regions 3, 4 and 5 and that of the gate electrode 7. The gate electrode 7 is provided over the second semiconductor region 4 through the insulation layer 6. The first and third semiconductor regions 3 and 5 are respectively provided with electrodes 7 and 8 Further, the first semiconductor region 3 may serve as a source region. The third semiconductor region 5 may serve as a drain region. The control electrode is provided by the gate electrode 7.

In the operation of the first embodiment, the n-type source region 3 and the p-type drain region 5 are biased in a forward direction, for instance, the source electrode 9 is grounded so that the source region 3 is taken into a ground potential. While the drain electrode is applied with a positive voltage. The gate electrode is applied with voltage signals. If the forward bias voltage is a relatively small and the gate voltage is zero, a diffusion current is approximately zero. At this time, a Fermi level on the p-type drain region 5 corresponds to an energy level in a band gap on the intrinsic semiconductor region 4. Then, there is no corresponding allowed state on the intrinsic semiconductor region 4. Therefore, no tunneling of electrons from the n-type source region 3 to the intrinsic semiconductor region 4 occurs. Consequently, a current between the source and drain regions 3 and 5 is approximately zero.

When the gate electrode 7 is applied with a relatively large positive voltage to cause a potential drop of a surface of the semiconductor region 4. Thus, high concentration electrons are caused at the surface of the second semiconductor region 4. As a carrier concentration further increases, a semiconductor at the surface region is taken into the degenerate state of n-type. Consequently, the semiconductor state at the surface region is approximately equivalent to that of the source region 3. The source region 3 and the second semiconductor region 4 are in a complete conductive state. While an interface of the second region 4 and the drain region 5 is formed with a forward-biased degenerate p-n junction. The forward-biased degenerate junction is equivalent to that of the Esaki Diode (tunnel diode). At this time, a Fermi level on the surface region of the second semiconductor region 4 corresponds to an energy level in the valance band on the drain region 5. Some electrons in the conduction band on the n-type degenerate surface region of the second semiconductor region 4 permit tunneling to vacant states in the valance band on the p-type degenerate drain region 5. Actually, a relatively large tunneling current flows through a tunnel barrier of a space charge region at the degenerate semiconductor junction.

Under the constant positive gate voltage, a current-voltage characteristic of the device possesses a negative differential resistance region separating two positive differential resistance regions. As the bias voltage increases form zero voltage, the tunneling current increases very rapidly. Until a Fermi level on the n-type region reaches an energy level corresponding to the valence band edge on the p-type drain region 5, the increasing of the tunneling current remains. When the Fermi level on the n-type region reaches the energy level corresponding to the valence band edge on the p-type drain region 5, the tunneling current reaches at a peak. As upon still further increase of the bias voltage, the Fermi level on the n-type region reaches an energy level corresponding to the energy band gap on the p-type drain region 5. When this happens, the number of electrons on the n-type region which are able to tunnel to vacant states in the valence band on the p-type drain region 5 decreases. Then, the tunneling current also decreases. The decrease of the tunneling current remains until a conduction band edge on the n-type region raises above the valence band edge on the p-type drain region 5. When the conduction band edge raises above the valence band edge, the tunneling is no longer possible. However, as the Fermi level on the n-type region raises above the conduction band edge on the p-type drain region 5, a diffusion current occurs instead of the tunneling current. When the bias voltage further more increases, the diffusion current also increases.

While, the concentration of electrons at the surface region of the second semiconductor region 4 is associated with the applied gate voltage. Also, the tunneling current and the diffusion current are associated with the concentration of electrons at the surface region of the second semiconductor region 4. As the positive gate voltage further increases, the concentration of electrons at the surface region rises. Therefore, the tunneling of electrons increases. Also, the diffusion current increases. It is therefore understood that the current-voltage characteristic is varied in association with the gate voltage.

Take GaAs as an example, at a free-carrier concentration of the first semiconductor region being $1 \times 10^{19}$ cm$^{-3}$, a free-carrier concentration of the third semiconductor region being $5 \times 10^{19}$ cm$^{-3}$, a bias voltage and a gate voltage being 1 V respectively. The current-voltage characteristic of the device manifests the negative differential resistance, for instance, a peak current of 0.1 A/cm$^2$ and a large peak-to-valley current ratio of 10 or larger. Further, the peak current is varied greatly in the range of different orders, typically several hundred micro amperes. The variation of the peak current is associated with many factors, for instance, free-carrier concentrations, materials, a bias voltage, a gate voltage, dimensions of the device and the others. While, the tunneling current tends to be independent of thermal factors.

Figure 3:
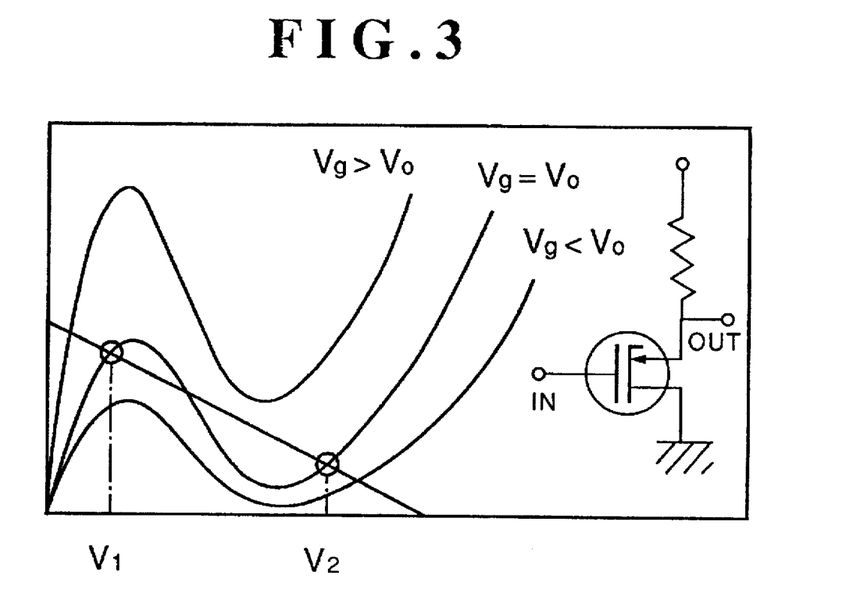
FIG. 3 is a diagram illustrative of a current-voltage characteristic of a three terminal tunnel device according to the present invention in which the device is biased and loaded with a resistance.

FIG. 3 illustrates the current-voltage characteristic of the three terminal tunnel device of the invention in which the device is biased and loaded with a resistance at the drain side. In FIG. 3, the vertical axis indicates a drain current and the horizontal axis indicates a drain voltage. The gate voltage Vg is taken as a parameter. The operating points of the circuit is expressed with intersection points of the load line and the current-voltage characteristic cured lines. At the gate voltage Vg=V$_0$, the device has two stable operating points, one corresponding to a high-current low-voltage state (V1) and the other corresponding to a low-current high-voltage state (V1). At this state, the circuit serves as a bistable circuit. The bistable circuit has two output voltages V1 and V2. The output voltages depend upon a hysteresis of the gate voltage. At the operating point of V1, a pulse voltage of Vg greater than V$_0$ is applied to the gate. Then, the operating point shifts to the left. At this time, the device has a monostable operating point, a high-current low-voltage point. Also, the circuit serves as a monostable circuit. As the gate voltage is taken into the V$_0$, the operating point returns to the V1 point. While, at the operating point V1, a pulse voltage of Vg smaller than V$_0$ is applied to the gate. Then, the operating point shifts to the right largely. At this time, the device has a monostable operating point, a low-current high-voltage. Also, the circuit serves as a monostable circuit. As the gate voltage is taken into the V$_0$, the operating point is taken into the V2 point. Further, at the operating point V2, a pulse voltage of Vg grater than V$_0$ is applied to the gate. Then, the operating point shifts to the left largely. As the gate voltage is taken into the V$_0$, the operating point is taken into the V1 point. It is understood that the circuit permits one stable operating point to shift to another stable operating point with gate voltage signals. The device may serve as a bistable circuit by use of a sole resistance.

From the set forth conditions of the first embodiment, the n-type source region 3 and the degenerate n-type surface region of the second region are same conductive type. Although it is desirable that the source region 3 is taken into the degenerate state, the source region 3 may be taken into a nearly degenerate state. While it is necessary that a semiconductor in the drain region 5 is in the degenerate state in order to have the degenerate p-n junction.

On the other hand, the gate electrode may be applied with a negative voltage under the forward bias. In this case, high concentration holes are caused at the surface region of the second semiconductor region 4. Since the semiconductor in the surface region of the second semiconductor region 4 is taken into the p-type degenerate state, a forward-biased degenerate p-n junction is formed between the source region 3 and the surface region of the second semiconductor region 4. Thus, the tunneling of electrons occurs at the interface of the source region 3 and the surface region of the second semiconductor region 4. The tunneling process is analogous to that of the set forth case of the positive gate voltage. In this condition, it is necessary that the semiconductor in the source region 3 is in the degenerate state in order to form the degenerate p-n junction. While, the second p-type semiconductor surface region and the p-type drain region are same conductive type. The semiconductor in drain region 5 may be taken into a nearly degenerate state, although it is not necessary to be so.

From the set forth descriptions, it is understood that the three terminal tunnel device according to the present invention exhibits the tunneling phenomenon in the forward-biased degenerate junction. Also, the device according to the invention has a current-voltage characteristic which possesses a negative differential resistance region separating two positive differential resistance regions. Further, the device according to the invention permits controlling a potential profile in the second semiconductor region 4, that is, a carrier concentration of the surface region of the second semiconductor region 4 by applying the voltage to the gate electrode. Thus, under the constant forward bias, the device allows the tunneling of carriers to be controlled with the gate voltage. In addition, the device permits the current-voltage characteristic to be controlled with the applied gate voltage to have multiple functions.

The three terminal tunnel device of the first embodiment may be fabricated by the following steps. First, a thick insulation layer 2 of silicon dioxide (SiO$_2$) is formed on a silicon (Si) substrate 1 by use of a chemical vapor deposition method. Second, a monocrystalline silicon (Si) thin layer of thickness of approximately 300 angstroms is formed on the thick insulation layer 2 by use of Silicon-On-Insulator. Third, a silicon dioxide (SiO$_2$) layer of thickness of approximately 150 angstroms is formed on the monocrystalline silicon (Si) thin layer by use of a thermal oxidation so that the monocrystalline silicon (Si) thin layer remains a thickness of approximately 200 angstroms. After a gate electrode of n-type polycrystalline silicon is formed on the silicon dioxide (SiO$_2$) layer, a source region is subjected to an ion-implantation of a high concentration arsenic (As) so as to take the source region into a n-type degenerate state. While, a drain region is subjected to an ion-implantation of a high concentration boron (B) so as to take the source region into a p-type degenerate state. Final, a source electrode and a drain electrode are formed by use of an aluminum evaporation.

In the first embodiment in which the degenerate p-n junction is formed at the interface of the drain region 5 and the surface of the second semiconductor region 4, the source region 3 may heavily be doped to have a high doping concentration, typically in the range from $10^{18}$ to $10^{20}$ cm$^{-3}$, although it is available to be higher. While the drain region may heavily be doped to have a high doping concentration, typically $10^{19}$ cm$^{-3}$ or higher so that the drain region 5 is taken into a degenerate state. While the second region is subjected to no doping. Then, the second region is an intrinsic semiconductor. The tunneling process is independent of the second region thickness, because the tunneling appears only at a surface of the second semiconductor region 4 which may serve as a channel. When the device is used as high frequency devices, it is desirable that the device is so designed that the channel length is very short. Assuming that the wavelength of electrons in silicon (Si) is approximately 100 angstroms at a room temperature, the channel length of approximately 300 to 500 angstroms is preferable. In contrast, when the device is used as low frequency devices, it is unnecessary to be so designated.

The thick insulation region 2 of SiO$_2$ has a thickness of approximately 100 angstroms or larger to permit an electric isolation of the three silicon regions from the silicon substrate. Further, the thick insulation layer 2 may comprise a material which has a wider band gap than that of the three semiconductor regions and that of the semiconductor substrate. The thin insulation layer of SiO$_2$ is so very thin as to permit the surface of the second region to be satisfied with high concentration carriers, either electrons or holes, with the gate voltage. At a gate voltage of 1 V, the thin insulation layer having a thickness of typically 50 to 100 angstroms is available. The $SiO_2$ of the insulation layer may be replaced with other materials, for instance, $Si_3N_4$ in which the layer may have a larger thickness than that of $SiO_2$. The using of high dielectric constant materials such as $Si_3N_4$ permits the layer to have a large thickness. Further, the thin insulation layer 6 may comprise a material which has a wider band gap than that of the second semiconductor region and that of the gate electrode to provide an electric isolation.

With regard to the formation of the source and drain electrodes, the source and drain electrodes may comprise ohmic contacts. Generally, a formation of a metal-semiconductor contact tends to produce a Schottky barrier, although the Schottky barrier provides some undesirable factors to the device. In contrast, the ohmic contact is not so. Typically, the ohmic contact may be formed by contacting of a metal with a semiconductor surface of a very high carrier concentration. In the device of the invention, since the source and the drain regions have a higher carrier concentration, the ohmic contacts may conveniently be formed. Whereby, the device of the invention possesses an improved electric stability and a minimum power loss without a desirable heat accumulation.

In a second preferred embodiment, the second semiconductor region 4 may comprise a n-type nondegenerate semiconductor.

In the structure, the first semiconductor region 3 is heavily doped with a n-type dopant so as to take a semiconductor into a degenerate state. The second semiconductor region is lightly doped with a n-type dopant so as to take a semiconductor into a nondegenerate state. While, the third semiconductor region 5 is heavily doped with a p-type dopant so as to take a semiconductor into a degenerate state. The insulation region 2 may be made of the same material as that of the first embodiment. The insulation layer 6 may also be made of the same material as that of the first embodiment. The gate electrode 7 is provided over the second semiconductor region 4 through the insulation layer 6. Further the first and third semiconductor regions 3 and 5 are respectively provided with electrodes. Further, the first semiconductor region 3 may serve as a source region. The third semiconductor region may serve as a drain region. The control electrode serves as a gate electrode.

In the operation of the second embodiment, the n-type source region 3 and the p-type drain region 5 are biased in a forward direction, for instance, the source electrode is grounded so that the source region 9 is taken into a ground potential. While the drain electrode is applied with a positive voltage. The gate electrode is applied with voltage signals. If the forward bias voltage is a relatively small and the gate voltage is zero, a diffusion current is approximately zero. Although a surface region of the second semiconductor region 4 is filled with some electrons, a carrier concentration is not sufficiently high. Then, a forward-biased nondegenerate p-n junction is formed at an interface of the n-type second semiconductor region 4 and the p-type drain region 5. Therefore, no tunneling of electrons from the n-type semiconductor region 4 to the p-type drain region 5 occurs. Consequently, a current between the source and drain regions 3 and 5 is approximately zero.

When the gate electrode 7 is applied with a relatively small positive voltage to cause a potential drop at the surface of the semiconductor region 4. Thus, high concentration electrons are caused at the surface of the second semiconductor region 4. Then, the semiconductor at the surface region is taken into the degenerate state of n-type. Consequently, the semiconductor state at the surface region of the second semiconductor region 4 is approximately equivalent to that in the source region 3. The source region and the second semiconductor region are in a complete conductive state. While an interface of the second semiconductor region 4 and the drain region 5 is formed with a forward-biased degenerate p-n junction. Some electrons in the conduction band on the n-type surface region of the second semiconductor region 4 permit tunneling to the p-type drain region 5. Then, a large tunneling current flows through a tunnel barrier of a space charge region at the degenerate semiconductor junction.

In this case, the tunneling process is analogous to that of the first embodiment. The device has a current-voltage characteristic manifesting the negative differential resistance.

The device of the second embodiment permits controlling the tunneling of electrons and the diffusion current with the gate voltage signals. Also, the device permits controlling the current-voltage characteristic with the gate voltage signals.

From the set forth conditions of the second embodiment, the n-type source region 3 and the degenerate n-type surface region of the second semiconductor region 4 are the same conductive type. Although it is desirable that the source region 3 is taken into the degenerate state, the source region 3 may be taken into a nearly degenerate state. While, it is necessary that the semiconductor in the drain region 5 is in the degenerate state in order to have the degenerate p-n junction.

On the other hand, the gate electrode may be applied with a negative voltage under the forward bias. In this case, a large negative gate voltage is required to allow high concentration holes to be caused at the surface region of the second semiconductor region 4. Since the surface region of the second semiconductor region 4 is taken into the p-type degenerate state, a forward-biased degenerate p-n junction is formed between the source region 3 and the surface region of the second semiconductor region 4. Thus, the tunneling of electrons occurs at the interface of the source region 3 and the surface region of the second semiconductor region 4. The tunneling process is analogous to that of the set forth case of the positive gate voltage. In this condition, it is necessary that the semiconductor in the source region 3 is in the degenerate state in order to form the degenerate p-n junction. While, the second p-type semiconductor surface region and the p-type drain region are the same conductive type. The semiconductor in drain region 5 may be taken into a nearly degenerate state, although it is not necessary to be so.

In a third embodiment, the second semiconductor region 4 may comprise a p-type nondegenerate semiconductor. In this case, the gate electrode may be applied with a negative voltage under the forward bias. In this case, a small negative gate voltage allows high concentration holes to be caused at the surface region of the second semiconductor region 4. Since the surface region of the second semiconductor region 4 is taken into the p-type degenerate state, a forward-biased degenerate p-n junction is formed between the source region 3 and the surface region of the second semiconductor region 4. Thus, the tunneling of electrons occurs at the interface of the source region 3 and the surface region of the second semiconductor region 4. The tunneling process is analogous to that of the set forth case. In this condition, it is necessary that the semiconductor in the source region 3 is in the degenerate state in order to form the degenerate p-n junction. While, the second p-type semiconductor surface region and the p-type drain region are same conductive type. The semiconductor in drain region 5 may be taken into a nearly degenerate state, although it is not necessary to be so.

On the other hand, the device of the third embodiment is also available at the positive gate voltage in which the surface of the second semiconductor region 4 is filled with electrons, although a large positive voltage is required to do so. The forward-biased degenerate p-n junction is formed at the interface of the second semiconductor region 4 and the drain region 5. The tunneling process and the current-voltage characteristic are analogous to that of the first embodiment.

In the fourth embodiments, the second semiconductor region 4 may comprise a n-type degenerate semiconductor.

In the structure, the first semiconductor region 3 is heavily doped with a n-type dopant so as to take a semiconductor into a degenerate state. The second semiconductor region is also heavily doped with a n-type dopant so as to take a semiconductor into a degenerate state. While, the third semiconductor region 5 is heavily doped with a p-type dopant so as to take a semiconductor into a degenerate state. The insulation region 2 may be made of the same material as that of the first embodiment. The insulation layer 6 may also be made of the same material as that of the first embodiment. The gate electrode 7 is provided over the second semiconductor region 4 through the insulation layer 6. The first and third semiconductor regions 3 and 5 are respectively provided with electrodes. Further, the first semiconductor region 3 may serve as a source region. The third semiconductor region 5 may serve as a drain region. The control electrode 7 may serve as a gate electrode.

In the operation of the fourth embodiment, the n-type source region 3 and the p-type drain region 5 are biased in a forward direction, for instance, the source electrode 9 is grounded so that the source region 3 is taken into a ground potential. While the drain electrode 8 is applied with a positive voltage. The gate electrode 7 is applied with voltage signals. In this case, under zero gate voltage, the semiconductor state of the second region 4 is approximately equivalent to that of the source region 3. The source region 3 and the second semiconductor region 4 are in a complete conductive state. While an interface of the second region 4 and the drain region 5 is formed with a forward-biased degenerate p-n junction. Some electrons in the conduction band on the n-type second semiconductor region permit tunneling to the p-type drain region 5. Then, a large tunneling current flows through a tunnel barrier of a space charge region at the degenerate p-n semiconductor junction.

When the gate electrode 7 is applied with a large negative voltage to cause a potential rising at the surface of the semiconductor region 4. Then, the forward-biased nondegenerate p-n junction at an interface of the n-type second semiconductor region 4 and the p-type drain region 5 is broken down. Thus, the tunneling of electrons from the conduction band on the n-type region to the valence band on the p-type region is no longer possible. Consequently, the tunneling current is also interrupted.

In this case, the tunneling process is analogous to that of the first embodiment. The device has a current-voltage characteristic manifesting the negative differential resistance.

The device of the fourth embodiment permits controlling the tunneling of electrons and the diffusion current with the gate voltage signals. Also, the device permits controlling the current-voltage characteristic with the gate voltage signals.

From the set forth conditions of the fourth embodiment, the n-type source region 3 and the n-type second degenerate semiconductor region are the same conductive type. Although it is desirable that the source region 3 is taken into the degenerate state, the semiconductor of the source region 3 may be taken into a nearly degenerate state. While it is necessary that the semiconductor in the drain region 5 is in the degenerate state in order to have the degenerate p-n junction.

In the fifth embodiment, the second semiconductor region 4 may comprise a p-type degenerate semiconductor.

In the structure, the first semiconductor region 3 is heavily doped with a n-type dopant so as to take a semiconductor into a degenerate state. While the second semiconductor region 4 is heavily doped with a p-type dopant so as to take a semiconductor into a degenerate state. The third semiconductor region 5 is also heavily doped with a p-type dopant so as to take a semiconductor into a degenerate state. The insulation region 2 may be made of the same material as that of the first embodiment. The insulation layer 6 may also be made of the same material as that of the first embodiment. The gate electrode 7 is provided over the second semiconductor region 4 through the insulation layer 6. The first and third semiconductor regions 3 and 5 are respectively provided with electrodes. Further, the first semiconductor region 3 may serve as a source region. The third semiconductor region may serve as a drain region. The control electrode serves as a gate electrode.

In the operation of the fifth embodiment, the n-type source region 3 and the p-type drain region 5 are biased in a forward direction, for instance, the source electrode 9 is grounded so that the source region 3 is taken into a ground potential. While the drain electrode 8 is applied with a positive voltage. The gate electrode 7 is applied with voltage signals. Under the zero gate voltage, the semiconductor state of the second region 4 is approximately equivalent to that in the drain region 5. The second semiconductor region 4 and the drain region 5 are in a complete conductive state. While an interface of the source region 3 and the second region 4 is formed with a forward-biased degenerate p-n junction. Some electrons in the conduction band on the n-type source region permit tunneling to the p-type second degenerate semiconductor region 4. Then, a large tunneling current flows through a tunnel barrier of a space charge region at the degenerate p-n semiconductor junction.

When the gate electrode 7 is applied with a large positive voltage to cause a potential drop at the surface of the semiconductor region 4. Then, the forward-biased nondegenerate p-n junction at an interface of the n-type source region 3 and the p-type second semiconductor region 4 is broken down. Thus, the tunneling of electrons from the conduction band on the n-type region to the valence band on the p-type region is no longer possible. Consequently, the tunneling current is interrupted.

In this case, the tunneling process is analogous to that of the first embodiment. The device has a current-voltage characteristic manifesting a negative differential resistance.

The device of the fifth embodiment permits controlling the tunneling of electrons and the diffusion current with the gate voltage signals. Also, the device permits controlling the current-voltage characteristic with the gate voltage signals.

From the set forth conditions of the fifth embodiment, the second p-type degenerate semiconductor region 4 and the drain region 5 are the same conductive type. Although it is desirable that the semiconductor of the drain region 5 is taken into the degenerate state, the drain region 5 may be taken into a nearly degenerate state. While, it is necessary that the semiconductor in the source region 3 is in the degenerate state in order to have the degenerate p-n junction.

From the set forth first to fifth embodiments, it is therefore understood that the three terminal tunnel device may operated in either the enhancement mode (as are first to third embodiments) or the depletion mode (as are forth and fifth embodiments) by matching the conditions.

The modifications of the materials of the three terminal tunnel device of the invention may greatly be varied as follows.

The first, second and third semiconductor regions 3, 4 and 5 may be made of the same semiconductor material such as silicon (Si) to form homojunctions. Further, Si may be replaced with other semiconductor materials, for instance, Ge, GaAs, InP, InGaAs, GaSb, InAs and the others.

While, the first, second and third semiconductor regions 3, 4 and 5 may be made of different semiconductor materials in order to form heterojunctions between Group IV semiconductor and Group IV semiconductor, for instance, Si/Ge, Si/SiGe, SiGe/Ge and the others. Further, heterojunctions between Group III–Group V semiconductor and Group III–Group V semiconductor, for instance, AlGaAs/GaAs, InAlAs/InGaAs, GaSb/InAs, InP/InGaAs, InAlAs/InP, InAsP/GaAs, InAs/InSb and the others are available. Furthermore, heterojunctions between Group iV semiconductor and Group III–Group V semiconductor, for instance, Ge/GaAs and the others are also available. Still further, heterojunctions between Group II–Group VI semiconductor and Group II–Group VI semiconductor, for instance, HgCdTe/CdTe, ZnS/ZnTe and the others are also available.

The insulation region 2 and the insulation layer 6 are made of silicon dioxide ($SiO_2$). Further, $SiO_2$ is replaced with other insulation material, for instance, $Si_3N_4$, SiON, $Al_2O_3$, $TiO_2$, $PbZrTiO_3$, CaF and the others. Furthermore, a wide band gap semiconductor, for instance, diamond, SiC and the others are available. In addition, in order to permit an electric isolation, the insulation region 2 and the insulation layer 6 may comprise a semiconductor material which has a wider band gap than that of the first, second and third semiconductor regions 3, 4 and 5. For instance, available combinations of the insulation region and the semiconductor region are a combination of Si insulation region and Ge semiconductor region, a combination of Si insulation region and SiGe semiconductor region, a combination of SiGe insulation region and Ge semiconductor region, a combination of AlGaAs insulation region and GaAs semiconductor region, a combination of InAlAs insulation region and InGaAs semiconductor region, a combination of GaSb insulation region and InAs semiconductor region, a combination of InP insulation region and InGaAs semiconductor region, a combination of InAlAs insulation region and InP semiconductor region, a combination of InAsP insulation region and GaAs semiconductor region, a combination of InAs insulation region and InSb semiconductor region, a combination of Ge insulation region and GaAs semiconductor region, a combination of HgCdTe insulation region and CdTe semiconductor region, a combination of ZnS insulation region and ZnTe semiconductor and the others.

The source, drain and gate electrodes 9, 8 and 7 may be made of aluminum (Al). Further, the gate electrode may be made of polycrystalline silicon or tungsten.

The modifications of the dimensions, the carrier concentrations of the first, second and third semiconductor regions, the bias voltage, the gate voltage and the other factors may be varied by matching the conditions.

Whereas modifications of the present invention will no doubt be apparent to a person of ordinary skilled in the art, it is to be understood that the embodiments shown and described by way of illustration are by no means intended to be considered in a limiting sense. Accordingly, it is to be intended by the claims to cover all modifications of the invention which fall within the spirit and scope of the invention.

What is claimed is:

1. A field effect transistor exhibiting a current-voltage characteristic of the negative differential resistance type, said field effect transistor, comprising:

an isolation region;

an intermediate region made of a non-degenerated semiconductor and provided on said isolation region;

an insulation layer formed on said intermediate region so that said insulation layer and said isolation region sandwich said intermediate region;

a source region made of a degenerated semiconductor of a first conductivity type, said source region being provided on said isolation region and being in contact with a first end of said intermediate region;

a drain region made of a degenerated semiconductor of a second conductivity type, said drain region being provided on said isolation region and being in contact with a second end of said intermediate region; and a control electrode provided on said insulation layer for applying an electric field to said intermediate region;

wherein said intermediate region has a thickness of approximately 200 angstroms, which allows at least an upper part of said intermediate region to change from said non-degenerated semiconductor into a degenerated semiconductor by said electric field, so as to substantially suppress a diffusion current flowing between said source and drain regions to thereby prevent any substantial increase of valley current involved in said current-voltage characteristic; and wherein said isolation region comprises an insulator selected from the group consisting of $SiO_2$, SiN4, SiON, $Al_2O_3$, $TiO_2$, $PbZrTiO_3$, and CaF.

2. The field effect transistor as claimed in claim 1, wherein said source and drain regions are respectively provided with ohmic contacts.

3. The field effect transistor as claimed in claim 1, wherein said source, drain and intermediate regions are made of the same semiconductor to form a homojunction.

4. The field effect transistor as claimed in claim 1, wherein said source, drain and intermediate regions are made of different semiconductors to form a heterojunction.

5. A field effect transistor exhibiting a current-voltage characteristic of the negative differential resistance type, said field effect transistor, comprising:

an isolation region;

an intermediate region made of a non-degenerated semiconductor and provided on said isolation region;

an insulation layer formed on said intermediate region so that said insulation layer and said isolation region sandwich said intermediate region;

a source region made of a degenerated semiconductor of a first conductivity type, said source region being provided on said isolation region and being in contact with a first end of said intermediate region;

a drain region made of a degenerated semiconductor of a second conductivity type, said drain region being provided on said isolation region and being in contact with a second end of said intermediate region; and a control electrode provided on said insulation layer for applying an electric field to said intermediate region;

wherein said intermediate region has a thickness of approximately 200 angstroms, which allows at least an upper part of said intermediate region to change from said non-degenerated semiconductor into a degenerated semiconductor by said electric field, so as to substantially suppress a diffusion current flowing between said source and drain regions to thereby prevent any substantial increase of valley current involved in said current-voltage characteristic; and wherein said isolation region comprises a semiconductor material having a significantly wider band gap than that of said source, drain and intermediate regions.

6. The field effect transistor as claimed in claim 1, wherein said non-degenerated semiconductor in said intermediate region is an intrinsic semiconductor.

7. The field effect transistor as claimed in claim 1, wherein said non-degenerated semiconductor in said intermediate region is doped by a dopant of the first conductivity type.

8. The field effect transistor as claimed in claim 1, wherein said non-degenerated semiconductor in said intermediate region is doped by a dopant of the second conductivity type.

9. A field effect transistor exhibiting a current-voltage characteristic of the negative differential resistance type, said field effect transistor, comprising:

an isolation region;

an intermediate region made of a degenerated semiconductor and provided on said isolation region;

an insulation layer formed on said intermediate region so that said insulation layer and said isolation region sandwich said intermediate region;

a source region made of a degenerated semiconductor of a first conductivity type, said source region being provided on said isolation region and being in contact with a first end of said intermediate region;

a drain region made of a degenerated semiconductor of a second conductivity type, said drain region being provided on said isolation region and being in contact with a second end of said intermediate region; and a control electrode provided on said insulation layer for applying an electric field to said intermediate region;

wherein said intermediate region has a thickness of approximately 200 angstroms, which allows at least an upper part of said intermediate region to change from said degenerated semiconductor into a non-degenerated semiconductor by said electric field, so as to substantially suppress a diffusion current flowing between said source and drain regions to thereby prevent any substantial increase of valley current involved in said current-voltage characteristic; and wherein said isolation region comprises an insulator selected from the group consisting of $SiO_2$, $SiN_4$, $SiON$, $Al_2O_3$, $TiO_2$, $PbZrTiO_3$, and $CaF$.

10. The field effect transistor as claimed in claim 9, wherein said source and drain regions are respectively provided with ohmic contacts.

11. The field effect transistor as claimed in claim 9, wherein said source, drain and intermediate regions are made of the same semiconductor to form a homojunction.

12. The field effect transistor as claimed in claim 9, wherein said source, drain and intermediate regions are made of different semiconductors to form a heterojunction.

13. The field effect transistor as claimed in claim 9, wherein said non-degenerated semiconductor in said intermediate region is doped by a dopant of the first conductivity type.

14. The field effect transistor as claimed in claim 9, wherein said non-degenerated semiconductor in said intermediate region is doped by a dopant of the second conductivity type.

15. The field effect transistor as claimed in claim 5, wherein said source and drain regions are respectively provided with ohmic contacts.

16. The field effect transistor as claimed in claim 5, wherein said source, drain and intermediate regions are made of the same semiconductor to form a homojunction.

17. The field effect transistor as claimed in claim 5, wherein said source, drain and intermediate regions are made of different semiconductors to form a heterojunction.

18. The field effect transistor as claimed in claim 5, wherein said non-degenerated semiconductor in said intermediate region is an intrinsic semiconductor.

19. The field effect transistor as claimed in claim 5, wherein said non-degenerated semiconductor in said intermediate region is doped by a dopant of the first conductivity type.

20. The field effect transistor as claimed in claim 5, wherein said non-degenerated semiconductor in said intermediate region is doped by a dopant of the second conductivity type.

21. A field effect transistor exhibiting a current-voltage characteristic of the negative differential resistance type, said field effect transistor, comprising:

an isolation region;

an intermediate region made of a degenerated semiconductor and provided on said isolation region;

an insulation layer formed on said intermediate region so that said insulation layer and said isolation region sandwich said intermediate region;

a source region made of a degenerated semiconductor of a first conductivity type, said source region being provided on said isolation region and being in contact with a first end of said intermediate region;

a drain region made of a degenerated semiconductor of a second conductivity type, said drain region being provided on said isolation region and being in contact with a second end of said intermediate region; and a control electrode provided on said insulation layer for applying an electric field to said intermediate region;

wherein said intermediate region has a thickness of approximately 200 angstroms, which allows at least an upper part of said intermediate region to change from said degenerated semiconductor into a non-degenerated semiconductor by said electric field, so as to substantially suppress a diffusion current flowing between said source and drain regions to thereby prevent any substantial increase of valley current involved in said current-voltage characteristic; and wherein said isolation region comprises a semiconductor material having a significantly wider band gap than that of said source, drain and intermediate regions.

22. The field effect transistor as claimed in claim 21, wherein said source and drain regions are respectively provided with ohmic contacts.

23. The field effect transistor as claimed in claim 21, wherein said source, drain and intermediate regions are made of the same semiconductor to form a homojunction.

24. The field effect transistor as claimed in claim 21, wherein said source, drain and intermediate regions are made of different semiconductors to form a heterojunction.

25. The field effect transistor as claimed in claim 21, wherein said non-degenerated semiconductor in said intermediate region is doped by a dopant of the first conductivity type.

26. The field effect transistor as claimed in claim 21, wherein said non-degenerated semiconductor in said intermediate region is doped by a dopant of the second conductivity type.

* * * * *